(12) United States Patent
Kishimoto

(10) Patent No.: US 10,052,657 B2
(45) Date of Patent: Aug. 21, 2018

(54) VACUUM DRYING APPARATUS AND METHOD OF MANUFACTURING FILM USING THE SAME

(71) Applicant: SAMSUNG DISPLAY CO., LTD., Yongin-si, Gyeonggi-do (KR)

(72) Inventor: Katsushi Kishimoto, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/236,805

(22) Filed: Aug. 15, 2016

(65) Prior Publication Data

US 2017/0317318 A1    Nov. 2, 2017

(30) Foreign Application Priority Data

Apr. 27, 2016    (KR) .......................... 10-2016-0051344

(51) Int. Cl.
*B05D 1/02* (2006.01)
*H01L 51/56* (2006.01)
*B05D 1/00* (2006.01)
*H01L 51/00* (2006.01)
*B05D 3/04* (2006.01)

(52) U.S. Cl.
CPC ............. *B05D 1/60* (2013.01); *B05D 3/0466* (2013.01); *B05D 3/0473* (2013.01); *H01L 51/0008* (2013.01); *H01L 51/0026* (2013.01); *H01L 51/56* (2013.01); *H01L 2227/323* (2013.01)

(58) Field of Classification Search
CPC ... H01L 51/56; H01L 51/001; H01L 51/0026; H01L 51/0029; H01L 51/5012; H01L 51/5056; H01L 51/5088; B05D 1/60; B05D 3/0466; B05D 3/0473
See application file for complete search history.

(56) References Cited

U.S. PATENT DOCUMENTS

| | | | | |
|---|---|---|---|---|
| 5,595,606 | A * | 1/1997 | Fujikawa | C23C 16/45561 118/715 |
| 6,502,530 | B1 * | 1/2003 | Turlot | C23C 16/455 118/723 E |
| 7,179,504 | B2 * | 2/2007 | Kitano | B05D 3/0466 118/50 |
| 7,655,111 | B2 * | 2/2010 | Horiguchi | H01J 37/32192 118/715 |
| 8,119,188 | B2 * | 2/2012 | Kuwabara | H01L 51/0003 427/384 |

FOREIGN PATENT DOCUMENTS

| | | |
|---|---|---|
| JP | 2008-202930 A | 9/2008 |
| JP | 2014-026764 A | 2/2014 |
| KR | 10-2006-0030444 A | 4/2006 |
| KR | 10-2012-0057437 A | 6/2012 |
| KR | 10-2014-0113399 A | 9/2014 |
| KR | 10-2017-0087102 A | 7/2017 |

* cited by examiner

*Primary Examiner* — Michael Trinh
(74) *Attorney, Agent, or Firm* — Lee & Morse P.C.

(57) ABSTRACT

A method of manufacturing a film includes disposing a substrate under one side of a baffle plate in a film manufacturing space, the baffle plate having a plurality of through-holes, and spraying an inert gas toward the substrate through a plurality of nozzle tips branched from a gas distribution pipe that is disposed over an other side of the baffle plate such that the inert gas penetrates the baffle plate through the through-holes.

16 Claims, 11 Drawing Sheets

VACUUM DRYING APPARATUS AND METHOD OF MANUFACTURING FILM USING THE SAME

CROSS-REFERENCE TO RELATED APPLICATION

Korean Patent Application No. 10-2016-0051344, filed on Apr. 27, 2016, in the Korean Intellectual Property Office, and entitled: "Vacuum Drying Apparatus and Method of Manufacturing Film Using the Same," is incorporated by reference herein in its entirety.

BACKGROUND

1. Field

Embodiments relate to a vacuum drying apparatus and a method of manufacturing a film using the same.

2. Description of the Related Art

An organic light-emitting device, which is a self-luminescent device, has advantages of a wide viewing angle, high contrast, rapid response speed, high brightness, excellent drive voltage characteristics, and excellent multi-coloring properties.

The organic light-emitting device has a structure in which a hole injection layer, a hole transport layer, and a light-emitting layer are disposed between an anode electrode injecting holes and a cathode electrode injecting electrons. When a voltage is applied between these electrodes, holes and electrons are recombined in the light-emitting layer to generate excitons, and these excitons are changed from an excited state to a ground state, thereby emitting light.

SUMMARY

Embodiments are directed to a method of manufacturing a film including disposing a substrate under one side of a baffle plate in a film manufacturing space, the baffle plate having a plurality of through-holes, and spraying an inert gas toward the substrate through a plurality of nozzle tips branched from a gas distribution pipe that is disposed over an other side of the baffle plate such that the inert gas penetrates the baffle plate through the through-holes.

The substrate may be a base substrate that has an organic material layer thereon. Spraying the inert gas may dry the organic material layer to form the film, the film being an organic film.

The method may further include reducing the pressure in the film manufacturing space. Reducing the pressure may include reducing the pressure from a first pressure to a second pressure, the second pressure being lower than the first pressure, for a first period of time, and maintaining the second pressure for second period of time, the second period of time being longer than the first period of time. Spraying the inert gas may include spraying the inert gas for third period of time while reducing the flow rate of the inert gas from a first flow rate to a second flow rate, the second flow rate being lower than the first flow rate, and spraying the inert gas for a fourth period of time, the fourth period of time being longer than the third period of time, while maintaining the second flow rate. The first period of time may overlap the third period of time, and the second period of time may overlap the fourth period of time. The beginning of maintaining the second pressure for the second period of time may precede the beginning of maintaining the second flow rate of spraying the inert gas for the fourth period of time.

Reducing the pressure may further include reducing the pressure from the second pressure to a third pressure, the third pressure being lower than the second pressure, after maintaining of second pressure. A change rate of pressure per unit time in reducing the pressure from the first pressure to the second pressure may be greater than a change rate of pressure per unit time in reducing the pressure from the second pressure to the third pressure.

The method may further include heating the baffle plate, heating a heating plate that is located on an opposite side of the substrate from the baffle plate, and heating a lateral heating plate that is located on a lateral side of a substrate drying space defined between the substrate and the baffle plate. A heating temperature of the heating plate may be higher than a heating temperature of the baffle plate. The heating temperature of the baffle plate may be higher than a heating temperature of the lateral heating plate. The heating temperature of the baffle plate may be 250° C. or higher.

The method may further include spraying a curtain gas using a curtain gas injection nozzle that surrounds a substrate drying space defined between the substrate and the baffle plate, the curtain gas injection nozzle including injection holes. A flow rate of the inert gas sprayed through the injection holes of the nozzle tips may be 1 to 3 times the flow rate of the curtain gas sprayed through the injection holes of the curtain gas injection nozzle.

The inert gas may be supplied from a gas supply source through a gas supply pipe connected with the gas supply source, the gas distribution pipe connected with the gas supply pipe, and the plurality of nozzle tips branched from the gas distribution pipe. The gas distribution pipe may extend in a first direction. A length of a first flow path extending from a point at which the gas supply pipe is directly connected with the gas distribution pipe to one end of the gas distribution pipe may be equal to a length of a second flow path extending from the point at which the gas supply pipe is directly connected with the gas distribution pipe to an other end of the gas distribution pipe.

The number of the gas distribution pipes may be $2^n$, where n is an integer of 1 or more. Different ones of the gas distribution pipes may be spaced apart from each other in a second direction crossing the first direction. The lengths of flow paths from the gas supply source to the gas distribution pipes may be equal to each other.

The gas distribution pipe may extend in a first direction. The plurality of nozzle tips includes a first nozzle tip located at one end of the gas distribution pipe extending in the first direction and a second nozzle tip located nearer to the center of the gas distribution pipe than the first nozzle tip. Each of the first nozzle tip and the second nozzle tip may have at least one injection hole that sprays gas. A flow rate of the inert gas sprayed through the injection hole of the first nozzle tip may be greater than a flow rate of the inert gas sprayed through the injection hole of the second nozzle tip.

Each of the nozzle tips may include a first injection hole and a second injection hole that spray the inert gas. A flow rate of the inert gas sprayed through the first injection hole may be different from A flow rate of the inert gas sprayed through the second injection hole.

Each of the nozzle tips may include an injection hole that sprays the inert gas. The angle between a gas spraying direction of the injection hole and one side of the substrate may be 30° to 45°.

Embodiments are also directed to a method of manufacturing a film including disposing a substrate between a first heating plate having a plurality of slits and a second heating plate spaced apart from and facing the first heating plate, and bringing a process gas having a temperature of 50° C. into contact with the substrate. Thermal conductivity in a substrate drying space defined by the substrate and the first heating plate may be substantially uniform.

The substrate may be a base substrate provided with an organic material layer. In bringing the process gas into contact with the substrate, the process gas may contact the organic material layer to form the film, the film being an organic film.

The organic material layer may contain a hole injection material, a hole transport material, and/or an organic luminescent material.

In bringing the process gas into contact with the substrate, the process gas may be sprayed toward the substrate using a plurality of nozzle tips penetrating the first heating plate.

The plurality of nozzle tips may include a first nozzle tip configured to spray the process gas toward the edge of the substrate and a second nozzle tip configured to spray the process gas toward the center of the substrate. Each of the first nozzle tip and the second nozzle tip may have an injection hole for spraying the process gas. The flow rate of the process gas sprayed through the injection hole of the first nozzle tip may be greater than the flow rate of the process gas sprayed through the injection hole of the second nozzle tip.

Embodiments are also directed to a method of manufacturing an organic light-emitting device, including providing a substrate including a base substrate and an organic material layer to form at least one of a hole injection layer, a hole transport layer, and an organic luminescent layer on the base substrate, disposing the substrate on a substrate mounting plate in a film manufacturing space such that the substrate is spaced apart from and facing a baffle plate, the baffle plate having a plurality of through-holes and a plurality of baffle slits, with nozzle tips penetrating respective ones of the through-holes, the nozzle tips being configured to spray a gas toward the substrate mounting plate, positioning the substrate mounting plate with respect to a gas flow blocking frame and a curtain gas injection nozzle such that an isolated substrate drying space is defined between the substrate mounting plate and the baffle plate, spraying a process gas toward the substrate through the plurality of nozzle tips such that the organic material layer is dried to form the at least one of a hole injection layer, a hole transport layer, and an organic luminescent layer on the base substrate.

The method may further include, during spraying the process gas, heating the baffle plate, heating a heating plate that is located on an opposite side of the substrate from the baffle plate, heating a lateral heating plate that is located on a lateral side of a substrate drying space, and supplying a curtain gas from injection holes of the curtain gas injection nozzle.

A flow rate of the process gas sprayed through the nozzle tips may be 1 to 3 times the flow rate of the curtain gas sprayed through the injection holes of the curtain gas injection nozzle, such that the curtain gas sprayed through the injection holes of curtain gas injection nozzle form a closed curve that flows in a periphery of the substrate drying space.

Spraying the process gas toward the substrate through the plurality of nozzle tips may include supplying the process gas to the nozzle tips from gas distribution pipes located on an opposite side of the baffle plate from the substrate mounting plate in the chamber, the gas distribution pipes being connected to a gas supply through a gas supply pipe having a cascading configuration such that flow paths from the gas supply to the gas distribution pipes are about equal in length.

A nozzle tip of the plurality of nozzle tips includes a first injection hole and a second injection hole facing in opposite directions, a diameter of the first injection hole and the second injection hole being selected according to a location of the nozzle tip among the plurality of nozzle tips to provide uniform drying of the substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
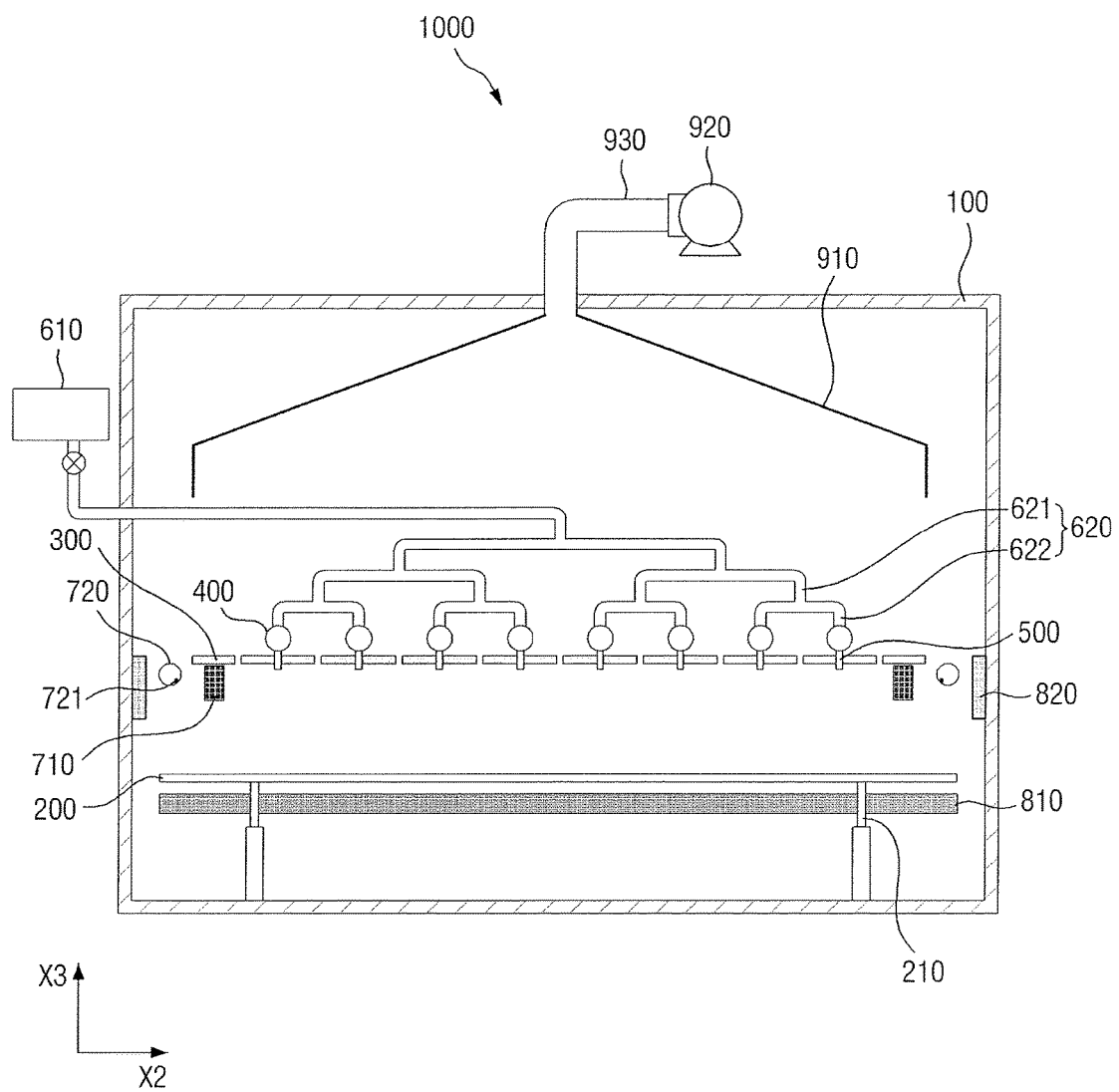
FIG. 1 illustrates a sectional side view of a vacuum drying apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Herein, the term "drying" refers to a process of gasifying a solvent component by heating the solvent component. For example, drying may be performed at a temperature of 0° C. or higher, 50° C. or higher, 100° C. or higher, 150° C. or higher, 200° C. or higher, 250° C. or higher, or 300° C. or higher.

Figure 2:
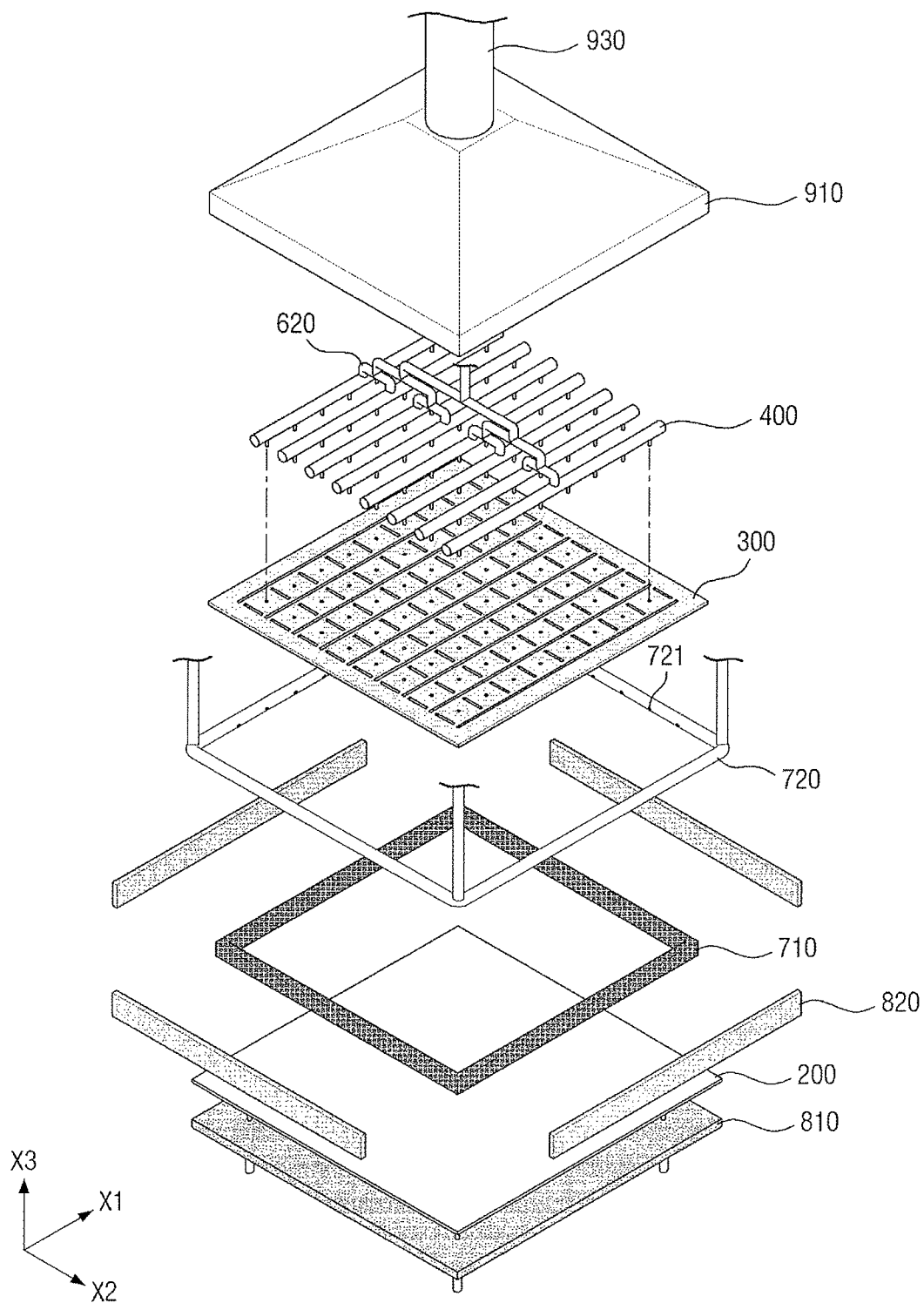
FIG. 2 illustrates a schematic exploded perspective view of the vacuum drying apparatus of FIG. 1.

FIG. 1 illustrates a sectional side view of a vacuum drying apparatus according to an embodiment. FIG. 2 illustrates a schematic exploded perspective view of the vacuum drying apparatus of FIG. 1.

Referring to FIGS. 1 and 2, the vacuum drying apparatus 1000 according to an embodiment includes a chamber 100, a substrate mounting plate 200 disposed in the chamber 100, a baffle plate 300 disposed over the substrate mounting plate 200 in the chamber 100, the baffle plate being spaced apart from and facing the substrate mounting plate 200 and having a plurality of through-holes 301, gas distribution pipes 400 disposed over the baffle plate 300 in the chamber 100, and a plurality of nozzle tips 500 protruding from each of the gas distribution pipes 400 and penetrating through the through-holes 301 of the baffle plate 300, the plurality of nozzle tips 500 being configured to spray gas toward the substrate mounting plate 200.

The chamber 100 may be configured to provide a space for performing a depressurization process and/or a drying process. The side wall of the chamber 100 may be provided with a slit-shaped substrate introducing portion and/or substrate withdrawing portion.

The substrate mounting plate 200 may be disposed in the chamber 100. The substrate mounting plate 200 may provide a space for stably mounting a substrate. FIG. 2 shows a case of the substrate mounting plate 200 having a rectangular shape. However, the substrate mounting plate 200 may have other suitable shapes. For example, the substrate mounting plate 200 may be circular. The substrate mounting plate 200 may be supported and lifted by a lifting mechanism. The lifting mechanism may include lift pins 210.

Figure 3:
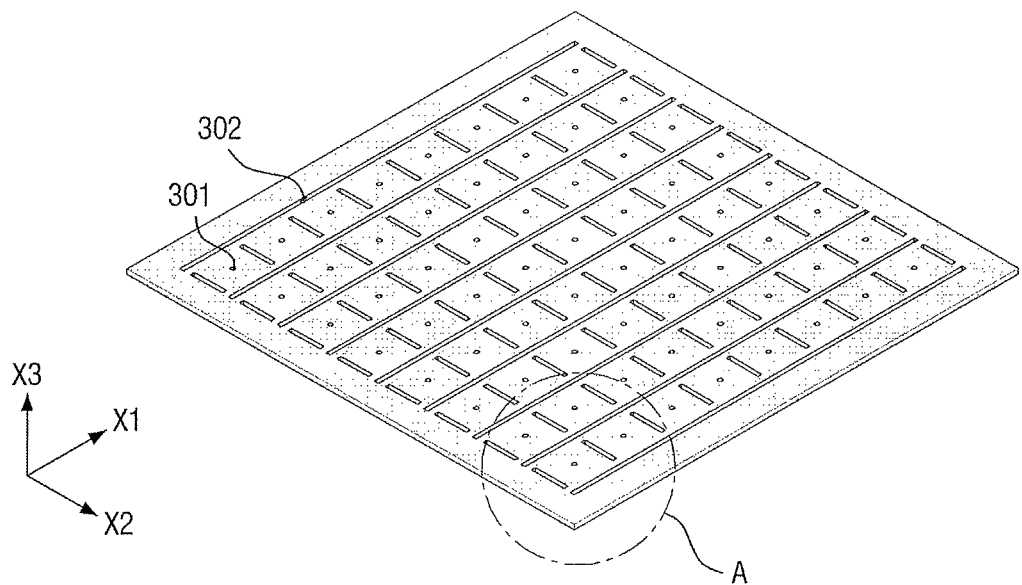
FIG. 3 illustrates a perspective view of the baffle plate of FIG. 1.
Figure 4:
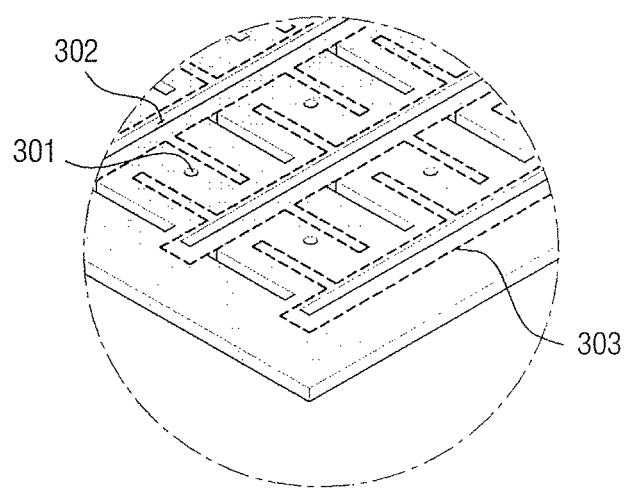
FIG. 4 illustrates an enlarged perspective view of the portion A of FIG. 3.

FIG. 3 illustrates a perspective view of the baffle plate of FIG. 1. FIG. 4 illustrates an enlarged perspective view of the portion A of FIG. 3.

Referring to FIGS. 1 to 4, the baffle plate 300 may be disposed over the substrate mounting plate 200 in the chamber 100. The baffle plate 300 may be spaced apart from the substrate mounting plate 200 and may face the substrate mounting plate 200. The baffle plate 300 may allows a gas flow moving from one side thereof to the other side thereof to be uniform. The baffle plate 300 may have a plurality of through-holes 301 and a plurality of baffle slits 302.

The through-holes 301, each having a substantially circular planar shape, may be spaced apart from each other in the first direction X1 and the second direction X2 in a matrix shape. The nozzle tips 500 to be described below may be inserted into the through-holes 301.

The baffle slits 302 may be configured to control a gas flow by circulating gas from one side to the other side of the baffle plate 300. The baffle slits 302 may have a suitable arrangement and shape. For example, the baffle slits 302 may include baffle slits extending in the first direction X1 and baffle slits extending in the second direction X2, and may be arranged in a substantially lattice shape. In another embodiment, the baffle plate 300 may include a plurality of baffle slits extending only in one direction, or may include a plurality of additional baffle holes each having a substantially circular planar shape.

In an exemplary embodiment, the vacuum drying apparatus 1000 may further include a heat source 303 configured to heat the baffle plate 300. The heat source 303 may include a hot wire inserted in the baffle plate 300. In another embodiment, the heat source 303 may include a light source configured to irradiate the baffle plate with light, or may include a heating plate disposed on one side of the baffle plate 300. When the heat source is a heating plate, the heating plate may have holes and/or slits having the same shape and arrangement as those of the baffle plate 300.

Figure 5:
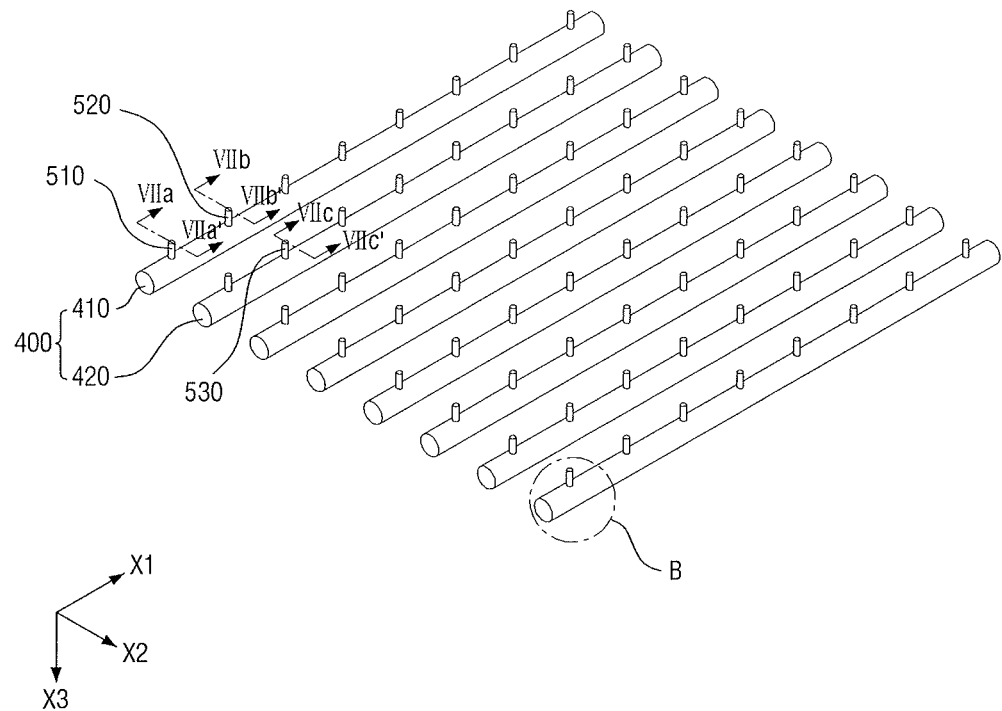
FIG. 5 illustrates a perspective view of the gas distribution pipes and nozzle tips of FIG. 1.
Figure 6:
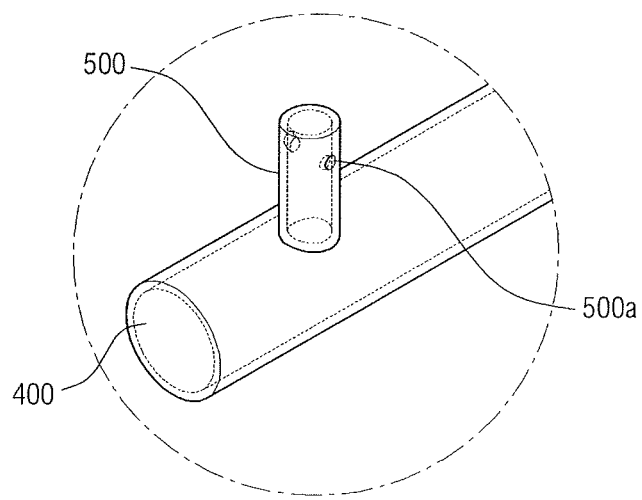
FIG. 6 illustrates an enlarged perspective view of the portion B of FIG. 5.

FIG. 5 illustrates a perspective view of the gas distribution pipes and nozzle tips of FIG. 1. FIG. 6 illustrates an enlarged perspective view of the portion B of FIG. 5.

Referring to FIGS. 1, 2, 5, and 6, each of the gas distribution pipes 400 may be disposed over the baffle plate 300 in the chamber 100. The plurality of nozzle tips 500 may protrude from each of the gas distribution pipes 400 toward the baffle plate 300.

Each of the gas distribution pipes 400 may serve to distribute the process gas supplied from a gas supply pipe 620 to the plurality of nozzle tips 500. The gas distribution pipe 400 may extend in the first direction X1 parallel to one side of the substrate mounting plate 200. The plurality of gas distribution pipes 400 may be provided in the chamber 100, and may be disposed to be spaced apart from each other in the second direction X2 parallel to one side of the substrate mounting plate 200. In some embodiments, the gas distribution pipes 400 may include a first gas distribution pipe 410 disposed at the outermost in the second direction X2 and a second gas distribution pipe 420 disposed nearer to the center in the second direction X2 compared to the first gas distribution pipe 410.

The plurality of nozzle tips 500 may be branched from the gas distribution pipe 400 to receive the process gas. As shown in FIG. 1, the lower end of the nozzle tip 500 may protrude below the bottom of the baffle plate 300. In other implementations, the lower end of the nozzle tip 500 protruding toward the baffle plate 300 may be located at a substantially equal level to the bottom of the baffle plate 300.

The plurality of nozzle tips 500 may include a plurality of injection holes 500a to spray the process gas supplied from the gas distribution pipe 400, respectively. The injection hole 500a, which is an opening extending from the inside to the outside of the nozzle tip 500, may be inclined downwardly so as to facilitate the spraying of the process gas.

Figure 7:
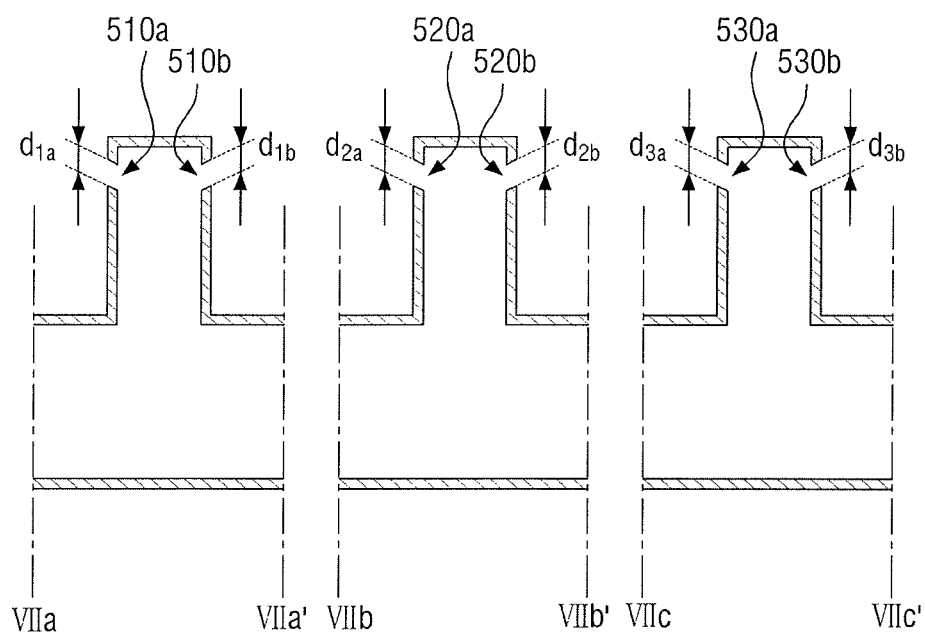
FIG. 7 illustrates sectional views comparing the sections taken along the lines VIIa-VIIa', VIIb-VIIb' and VIIc-VIIc' of FIG. 5.

FIG. 7 illustrates sectional views comparing the sections taken along the lines VIIa-VIIa', VIIb-VIIb' and VIIc-VIIc' of FIG. 5.

Referring to FIGS. 5 to 7, the plurality of nozzle tips may be branched from the first gas distribution pipe 410. The plurality of nozzle tips may include a first nozzle tip 510 branched from the first gas distribution pipe 410 and located at one end of the first gas distribution pipe 410 in the first direction X1, a second nozzle tip 520 branched from the first gas distribution pipe 410 and located closer to the center of the first gas distribution pipe 410 than the first nozzle tip 510, and a third nozzle tip 530 branched from the second gas distribution pipe 420. The first nozzle tip 510 may be a nozzle tip that sprays the process gas toward the edge of a substrate mounted on the substrate mounting plate 200 in the first direction X1. The second nozzle tip 520 may be a nozzle tip that sprays the process gas toward the edge of the substrate in the second direction X2, similar to the third nozzle tip 530.

Each of the nozzle tips 500 may include two injection holes 500a located at opposite sides thereof in the second direction X2. For example, the plurality of injection holes 500a may include a first injection hole 510a located at one side of the first nozzle tip 510 in the second direction X2, a second injection hole 510b located at the other side of the first nozzle tip 510 in the second direction X2, a third injection hole 520a located at one side of the second nozzle tip 520 in the second direction X2, a fourth injection hole 520b located at the other side of the second nozzle tip 520 in the second direction X2, a fifth injection hole 530a located at one side of the third nozzle tip 530 in the second direction X2, and a sixth injection hole 530b located at the other side of the third nozzle tip 530 in the second direction X2. In other implementations, the injection holes may be located at one side and the other side in the first direction X1, may be located at all sides in both the first direction X1 and the second direction X2, or may be located at all sides in different directions crossing the first direction X1 and second direction X2.

In an exemplary embodiment, the nozzle tips 500 and the injection holes 500a may be configured to spray a larger amount of process gas toward the edge of a substrate mounted on the substrate mounting plate 200 compared to the center of the substrate. In the case of the center of the substrate, the process gas may be sprayed through the plurality of adjacent injection holes, whereas, the edge of the substrate is adjacent to a smaller number of injection holes compared to the center thereof. Accordingly, the injection amount of the process gas may be changed depending on the position of the substrate, so as to enable more uniform drying.

For example, the section area of the first injection hole 510a may be larger than the section area of the second injection hole 510b. In the case where the section of the injection hole has a substantially circular shape, the diameter ($d_{1a}$) of the first injection hole 510a may be larger than the diameter ($d_{1b}$) of the second injection hole 510b. The first injection hole 510a may be an injection hole that sprays the process gas toward the edge of the substrate in the second direction X2 compared to the second injection hole 510b.

The diameter ($d_{2a}$) of the third injection hole 520a may be larger than the diameter ($d_{2b}$) of the fourth injection hole 520b. The third injection hole 520a may be an injection hole that sprays the process gas toward the edge of the substrate (not shown) in the second direction X2 compared to the fourth injection hole 520b. The diameter ($d_{3a}$) of the fifth injection hole 530a may be equal to or different from the diameter ($d_{3b}$) of the sixth injection hole 530b.

The section area of the first injection hole 510a may be larger than the section area of the third injection hole 520a. For example, the diameter ($d_{1a}$) of the first injection hole 510a may be larger than the diameter ($d_{2a}$) of the third injection hole 520a. The first injection hole 510a may be an injection hole that sprays the process gas toward the edge of the substrate in the first direction X1, similar to the third injection hole 520a. The diameter ($d_{1b}$) of the second injection hole 510b may be equal to or different from the diameter ($d_{2a}$) of the third injection hole 520a. The diameter ($d_{2a}$) of the third injection hole 520a may be larger than the diameter ($d_{3a}$) of the fifth injection hole 530a. The third injection hole 520a is an injection hole that sprays the process gas toward the edge of the substrate in the second direction X2 similar to the fifth injection hole 530a. The diameter ($d_{2b}$) of the fourth injection hole 520b may be equal to or different from the diameter ($d_{3a}$) of the fifth injection hole 530a.

In some implementations, the number, arrangement and sizes of the injection holes may be variously changed. For example, the section areas of all the injection holes may be substantially equal to each other.

The gas distribution pipes 400 occupying a relatively large volume are disposed over the baffle plate 300. The nozzle tips 500 branched from the gas distribution pipes 400 may be configured to penetrate the baffle plate 300 to spray the process gas toward the substrate mounting plate 200, thereby maintaining the thermal conductivity in the substrate drying space defined between the baffle plate 300 and the substrate mounting plate 200 to be substantially uniformly. Accordingly, there may be an effect of reducing the heat loss of process gas and completely transferring the heat of process gas to the substrate. Further, when additional pipes are not disposed in the substrate drying space, the occurrence of turbulent flow of process gas may be prevented, so as to reduce the difference between drying path and exhaust path according to the position of the substrate.

Referring again to FIGS. 1 and 2, the vacuum drying apparatus may further include a gas supply source 610 that supplies process gas to the gas distribution pipes 400, and a gas supply pipe 620 that forms a flow path from the gas supply source 610 to the gas distribution pipes 400.

The gas supply source 610 may be disposed outside the chamber 100. The gas supply source 610 may be configured to store process gas and supply the process gas into the chamber 100. The process gas may include an inert gas. For example, the process gas may be a stable material having low reactivity. For example, the process gas may be nitrogen ($N_2$) gas or argon (Ar) gas or may be nitrogen ($N_2$) gas or argon (Ar) gas doped with hydrogen ($H_2$) gas and/or carbon monoxide (CO) gas. The gas supply pipe 620 may connects the gas supply source 610 disposed outside the chamber 100 with the gas distribution pipes 400 disposed in the chamber 100. In an exemplary embodiment, the gas supply pipe 620 may have a cascade structure in which one pipe that is directly connected with the gas supply source 610 is branched into two pipes, each of the two pipes is branched into two pipes, etc. For example, the gas supply pipe 620 may include a first subsidiary gas supply pipe 621 extending in one direction (for example, third direction X3), and two second subsidiary gas supply pipes 622 branched from the first subsidiary gas supply pipe 621 and directly connected with the gas distribution pipes 400. In this case, the number of each of the second subsidiary gas supply pipes 622 and the gas distribution pipes 400 may be $2^n$ (where n is an integer of 1 or more). When the gas supply pipe 620 connecting the gas supply source 610 and the plurality of gas distribution pipes 400 is configured in the form of a cascade, the lengths of flow paths extending from the gas supply source 610 to the $2^n$ gas distribution pipes 400 may be substantially equal to each other. Thus, the amounts of process gas transferred to the plurality of gas distribution pipes 400 may be equal to each other. Herein, the term "length of a flow path" refers to the length of a gas flow path.

Further, the length of a first flow path extending from the point, at which the second subsidiary gas supply pipe 622 is directly connected with the gas distribution pipe 400, to one end of the gas distribution pipe 400 in the first direction X1 may be equal to the length of a second flow path extending from the point to the other end of the gas distribution pipe 400 in the first direction X1.

In some implementations, the shape and arrangement of the gas supply pipe 620 may be variously modified.

In an exemplary embodiment, the vacuum drying apparatus 1000 may further include: a gas flow blocking unit including a gas flow blocking frame 710 and a curtain gas injection nozzle 720, a heat supply unit including a lower heating plate 810 and a lateral heating plate 820, and an exhaust unit including an exhaust hood 910, an exhaust pump 920, and an exhaust pipe 930.

The gas flow blocking frame 710 may be disposed between the substrate mounting plate 200 and the baffle plate 300 along the edge of the baffle plate 300. At least a part of the gas flow blocking frame 710 may overlap the substrate mounting plate 200 and the baffle plate 300.

The curtain gas injection nozzle 720 may extend in the first direction X1 and second direction X2, and may be disposed to surround the gas flow blocking frame 710. The curtain gas injection nozzle 720 may be configured to spray curtain gas toward the gas flow blocking frame 710, for example, toward the region in which the gas flow blocking frame 710 is in contact with curtain gas injection nozzle 720. For example, the curtain gas injection nozzle 720 may receive curtain gas from a curtain gas supply source disposed outside the chamber 100, and may spray the curtain gas toward the gas flow blocking frame 710 through a plurality of curtain gas injection holes 721. The curtain gas may be inert gas.

The gas flow blocking frame 710 and the curtain gas injection nozzle 720 may serve to mutually isolate a space in which a drying process is performed (that is, a substrate drying space) from other spaces in the chamber 100. For example, the gas flow blocking frame 710 may physically close off the lateral sides of the substrate drying space to minimize the opening area, and the curtain gas injection nozzle 720 may spray the curtain gas to form a gas curtain, thereby preventing gas flow from being formed between the inside and outside of the substrate drying space. The substrate drying space will be described below in detail with reference to FIG. 8.

The lower heating plate 810 may be disposed under the substrate mounting plate 200 in the chamber. The lower heating plate 810 may be fixed and lifted by a lift pin 210 together with the substrate mounting plate 200. The lower heating plate 810 may supply heat toward the bottom of the substrate mounting plate 200.

The lateral heating plate 820 may be disposed on the inner side wall of the lateral portion of chamber 100. For example, the lateral heating plate 820 may be disposed to surround the gas flow blocking frame 710. The lateral heating plate may supply heat toward the lateral side of the substrate mounting plate 200.

The exhaust hood 910 may be disposed adjacent to the ceiling of the chamber 100. The exhaust hood 910 may be located over the gas distribution pipe 400 to face the baffle plate 300. The exhaust hood 910 may effectively trap the gas moving upward from the lower side of the baffle plate 300. The planar area of the exhaust hood 910 may be equal to or larger than the planar area of the baffle plate 300. For example, the exhaust hood 910 may completely cover or overlap the baffle plate 300. Further, in the case where the exhaust hood 910 has an inclination as shown in FIG. 1, a difference in path length between the gas flow moving upward from the edge of the baffle plate 300 and the gas flow moving upward from the center thereof can be reduced.

The exhaust pump 920 may be disposed outside the chamber 100 to control or maintain the pressure in the chamber 100. For example, the exhaust pump 920 may exhaust the gas in the chamber 100 to the outside of the chamber 100 to reduce the pressure in the chamber 100, thereby approximating the atmosphere in the chamber 100 to the vapor pressure of a material to be dried, for example, an organic material, so as to easily gasify the organic material. Further, the exhaust pump 920 may rapidly suck the organic material gas generated by the gasification of the organic material and the process gas, so as to maintain the pressure in the chamber 100 and improve the drying characteristics of the organic material. The exhaust pump 920 may be, for example, a dry pump or a turbo pump.

The exhaust pipe 930 may connect the inside of the chamber 100 with the exhaust pump 920 disposed outside the chamber 100 to provide a path for exhausting the gas trapped by the exhaust hood 910. The exhaust pipe 930 may be connected to the center of the exhaust hood 910.

Hereinafter, a method of manufacturing a film according to an embodiment will be described.

The method of manufacturing a film according to an embodiment may include forming an organic material layer on a base substrate, and drying the organic material layer using the vacuum drying apparatus of FIG. 1. In drying the organic material layer, the organic material layer may be cured by drying the organic material layer, or the organic material layer may be baked by drying the organic material layer.

An organic material layer may be formed on a base substrate. The organic material layer may be formed by applying an organic material solution onto the base substrate. When this method of manufacturing a film is applied to a method of manufacturing an organic light-emitting device, the organic material layer may comprise a hole injection material, a hole transport material, and/or an organic luminescent material. Herein, the term "base substrate" may include an intermediate structure to which the organic material layer is applied in forming the organic light-emitting device. For convenience of explanation, the base substrate provided with the organic material layer is referred to as a "substrate".

The hole injection material may include a phthalocyanine compound, such as CuPc; a triphenylamine compound, such as m-MTDATA (4,4',4''-tris(N-3-methylphenyl-N-phenylamino)triphenylamine), TDATA (4,4',4''-tris(diphenylamino) triphenylamine), or 2-TNATA (4,4',4''-tris[2-naphthyl(phenyl)-amino]triphenylamine); or PEDOT/PSS (poly(3,4-ethylenedioxythiophene)/polystyrene sulfonate), as examples. The hole transport material may include NPD (4,4'-bis[N-(1-naphthyl)-N-phenyl-amino]biphenyl), TPD (N,N-diphenyl-N,N-bis[3-methylphenyl]-1,1'-biphenyl-4,4'-diamine), or NPB (N,N'-di(naphthalene-1-yl)-N,N'-diphenyl-benzidine), as examples. The organic luminescent material may include $Alq_3$ (tris-(8-hydroxyquinolinato)aluminum(III)), CBP (4,4'-N,N'-dicarbazole-biphenyl), PVK (poly(N-vinylcarbazole)), AND (9,10-bis(2-naphthalenyl) anthracene), TPBi (1,3,5-tris(N-phenylbenzimidazole-2-yl) benzene), TBADN (2-(t-butyl)-9,10-bis(20-naphthyl) anthracene), DSA (distyrylarylene), CDBP (4,4'-Bis(9-carbazolyl)-2,2'-dimethyl-biphenyl), or MADN (2-methyl-9,10-bis(naphthalen-2-yl)anthracene), as examples.

The substrate may be dried using the vacuum drying apparatus of FIG. 1. Drying the substrate using the vacuum drying apparatus may include disposing the substrate in the vacuum drying apparatus, and reducing the pressure in the chamber of the vacuum drying apparatus, and spraying process gas.

Figure 8:
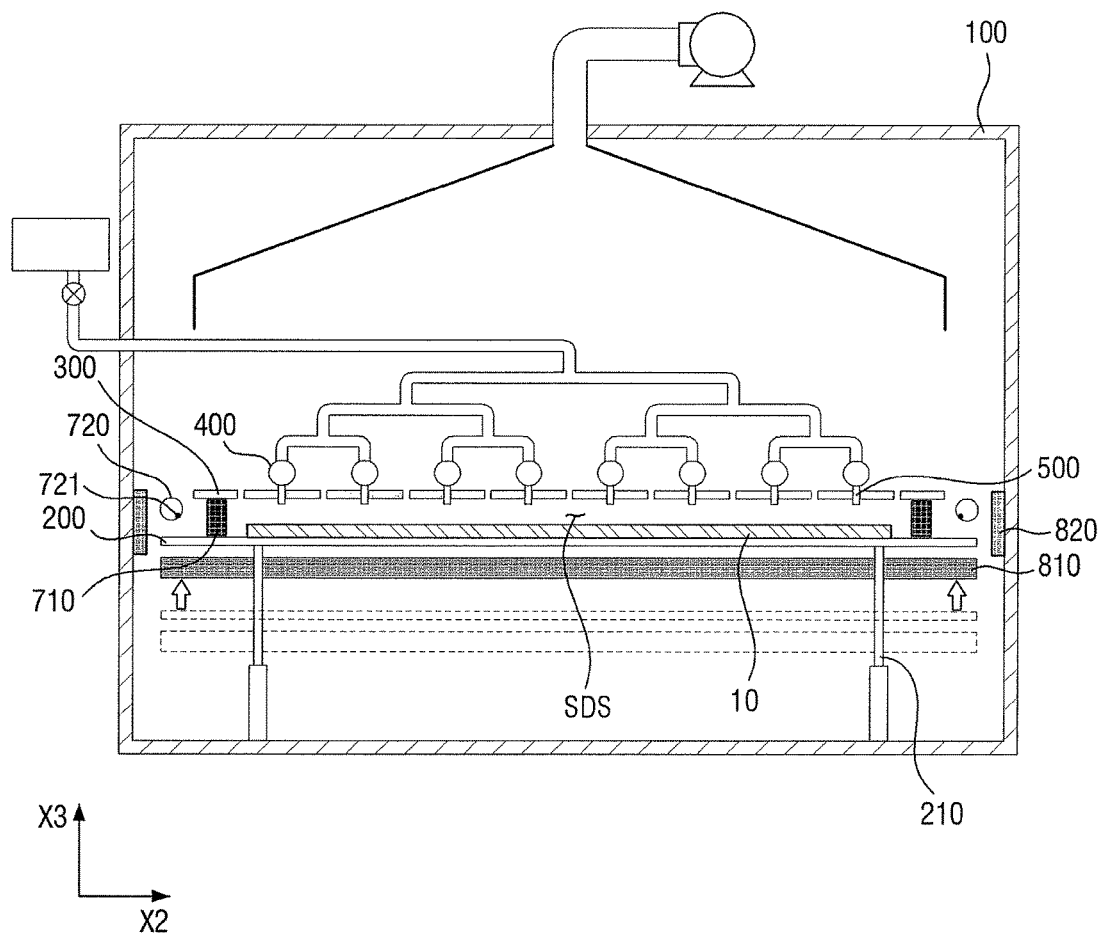
FIGS. 8 to 11 illustrate views for explaining a method of manufacturing a film according to an embodiment.
Figure 9:
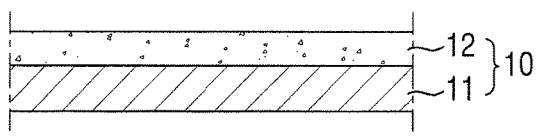
Figure 10:
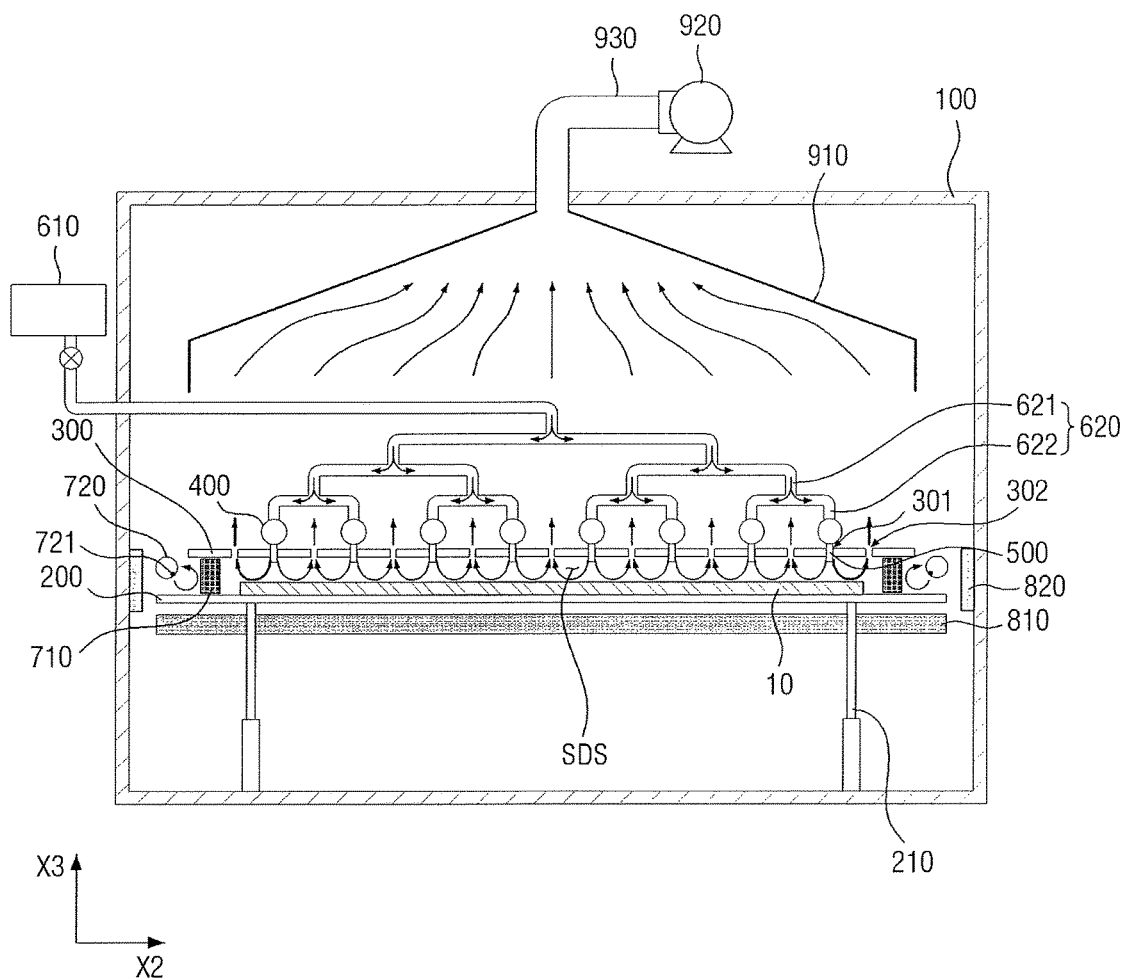

FIG. 8 illustrates a sectional side view of the vacuum drying apparatus in which the substrate is mounted, and FIG. 9 illustrates an enlarged sectional view of a part of the substrate in the step of FIG. 8. FIG. 10 illustrates a sectional side view of the vacuum drying apparatus during reducing the pressure in the chamber of the vacuum drying apparatus and spraying process gas.

Referring to FIGS. 8 and 9, in mounting the substrate 10 in the vacuum drying apparatus, a base substrate 11 provided with an organic material layer 12 may be disposed under the baffle plate 300 having the plurality of through-holes. As described above, the substrate 10 may be the base substrate 11 provided with the organic material layer 12. For example, the substrate may be disposed on the substrate mounting plate 200 disposed between the baffle plate 300 and the lower heating plate 810. Mounting the substrate 10 in the vacuum drying apparatus may include disposing the substrate 10 on the substrate mounting plate 200 and lifting the substrate mounting plate 200 and the substrate 10 using the lift pin 210 to locate the substrate 10 under the baffle plate 300. The substrate mounting plate 200 may be lifted to the position at which the substrate mounting plate 200 is in contact with the gas flow blocking frame 710. In this case, the substrate mounting plate 200, the baffle plate 300, and the gas flow blocking frame 710 define a substrate drying space SDS. The substrate drying space is a space in which the drying of the substrate 10 is substantially performed, and can be distinguished from other spaces in the chamber 100. For example, the gas flow blocking frame 710 may physically close the lateral sides of the substrate drying space SDS to minimize the opening area, and the curtain gas injection nozzle 720 may spray a curtain gas to prevent a gas flow from being formed between the inside and outside of the substrate drying space SDS. When the process gas has contributed to the drying of the substrate 10, the process gas may be discharged from the substrate drying space SDS through the baffle slits 302 of the baffle plate 300.

Subsequently, referring to FIG. 10, reducing the pressure in the chamber and spraying the process gas may include spraying the process gas, and reducing the pressure in the chamber.

In spraying the process gas, the process gas may be sprayed toward the substrate 10 using the plurality of nozzle tips 500 branched from the gas distribution pipe 400 and penetrating the baffle plate 300 through the through-holes 301 of the baffle plate 300. For example, the process gas supplied from the gas supply source 610 disposed outside the chamber 100 may be sprayed toward the substrate 10 through the gas supply pipe 620, the gas distribution pipe 400 connected to the gas supply pipe 620, and the plurality of nozzle tips 500 branched from the gas distribution pipe 400. The process gas may be inert gas with a temperature of 50° C. or higher, 100° C. or higher, 150° C. or higher, 200° C. or higher, 250° C. or higher, or 300° C. or higher. The process gas may be sprayed at a flow rate of about 0.2 to 3 SLM.

The nozzle tips 500 and the injection holes 500a thereof may be configured to spray a larger amount of process gas toward the edge of the substrate 10 compared to the center of the substrate 10. For example, the flow rate of the process gas sprayed through the injection holes of the first nozzle tips for spraying the process gas toward the edge of the substrate 10 may be greater than the flow rate of the process gas sprayed through the injection holes of the second nozzle tips for spraying the process gas toward the center of the substrate 10. As described above, one nozzle tip may include a first injection hole and a second injection hole (for example, injection holes 510a and 510b in FIG. 7). The flow rate of the process gas sprayed through the first injection hole for spraying the process gas toward the edge of the substrate 10 may be greater than the flow rate of the process gas sprayed through the second injection hole for spraying the process gas toward the center of the substrate 10.

The injection hole, which is an opening extending from the inside to the outside of the nozzle tip, may be inclined downwardly in order to easily spray the process toward the substrate mounting plate. For example, the angle between the process gas spraying direction of the injection hole and one side of the substrate 10 may be 30° to 45°. When the angle is within the above range, it may be possible to prevent the substrate 10 from being damaged by the injection pressure of process gas, and may be possible to suppress the occurrence of turbulent flow by forming a stable gas flow. In addition, the substrate 10 may be stably dried by the described injection hole and other injection holes adjacent thereto.

The process gas sprayed through the nozzle tips 500 may be applied to the substrate 10 to dry an organic material. The process gas may exit the substrate drying space SDS through the baffle slits 302 of the baffle plate 300, and may be discharged to the outside of the chamber 100 through the exhaust unit. In an exemplary embodiment, the substrate drying space SDS may be isolated from other spaces in the chamber 100, and thus the process gas sprayed through the nozzle tips 500 may be exhausted through only the baffle slits 302. For example, the amount of the process gas sprayed through the nozzle tips 500 may be substantially equal to the amount of the process gas exiting through the baffle slits 302.

In the method of manufacturing a film according to this embodiment, the gas distribution pipes 400 may be disposed over the baffle plate 300. Thus, the thermal conductivity between the substrate 10 and the baffle plate 300 may be maintained substantially uniformly. Further, a configuration obstructing a gas flow does not exist in the gas flow path extending from the nozzle tip 500 to the substrate 10 and in the gas flow path extending from the substrate 10 to the baffle slit 302, and thus a stable gas flow path may be formed. Moreover, the gas supply pipe 620 may be in a form of a cascade. Thus, the lengths of flow paths from the gas supply source 60 to the $2^n$ gas distribution pipes may be substantially equal to each other. Spraying the process gas will be described in detail with reference to FIG. 11.

In an exemplary embodiment, the method of manufacturing a film may further include heating the baffle plate 300 disposed over the substrate 10, heating the heating plate 810 disposed under the substrate 10, heating the lateral heating plate 820 disposed on the lateral side of the substrate drying space SDS defined between the substrate 10 and the baffle plate 300, and/or spraying curtain gas using the curtain gas injection nozzle 720 disposed to surround the substrate drying space SDS.

The baffle plate 300 may be a first heating plate disposed over the substrate 10, and the lower heating plate 810 may be a second heating plate disposed under the substrate 10. When the upper and lower sides of the substrate 10 are simultaneously heated, solvent vapors may be condensed again, thereby minimizing the contamination of the substrate 10. For example, the heating temperature of the lower heating plate 810 may be equal to or higher than the heating temperature of the baffle plate 300. The heating temperature of the baffle plate 300 may be about 250° C. or higher. Further, the heating temperature of the baffle plate 300 may be higher than the heating temperature of the lateral heating plate 820. When the heating temperature of the lateral heating plate 820 is lower than the heating temperature of the baffle plate 300, the flow of curtain gas to be described below may be stabilized, and the substrate drying space SDS can be effectively isolated.

The flow rate of curtain gas sprayed through the curtain gas injection nozzle 720 may be about 0.2 to 3 SLM. The flow rate of process gas sprayed through the injection hole of the nozzle tip 500 may be about 1 to 3 times, or, for example, about 1.6 to 2 times the flow rate of curtain gas sprayed through the curtain gas injection nozzle 720. When the flow rate of curtain gas and the flow rate of process gas are respectively controlled with the above ranges, the substrate drying space SDS may be isolated from the outside, such that it may be possible to prevent impurities from adhering to the substrate 10 in the substrate drying space SDS. The loss of process gas may be prevented so as to completely use the process gas in drying the substrate 10. The temperature of the curtain gas may be lower than the temperature of the process gas. For example, the curtain gas may be an inert gas having a temperature of about 50° C. or higher, about 100° C. or higher, or about 120° C.

Since the shape, operation and arrangement of the baffle plate 300, the lower heating plate 810, and the lateral heating plate 820 have been described with reference to FIG. 1, detailed descriptions thereof will not be repeated.

The chamber may be exhausted to reduce the pressure in the chamber to a predetermined pressure using the exhaust unit including the exhaust hood 910, the exhaust pump 920, and the exhaust pipe 930. The predetermined pressure may be about $10^{-4}$ Torr to $10^{-1}$ Torr. The atmosphere in the chamber may approximate the vapor pressure of an organic material, and thus, the organic material may be gasified.

Figure 11:
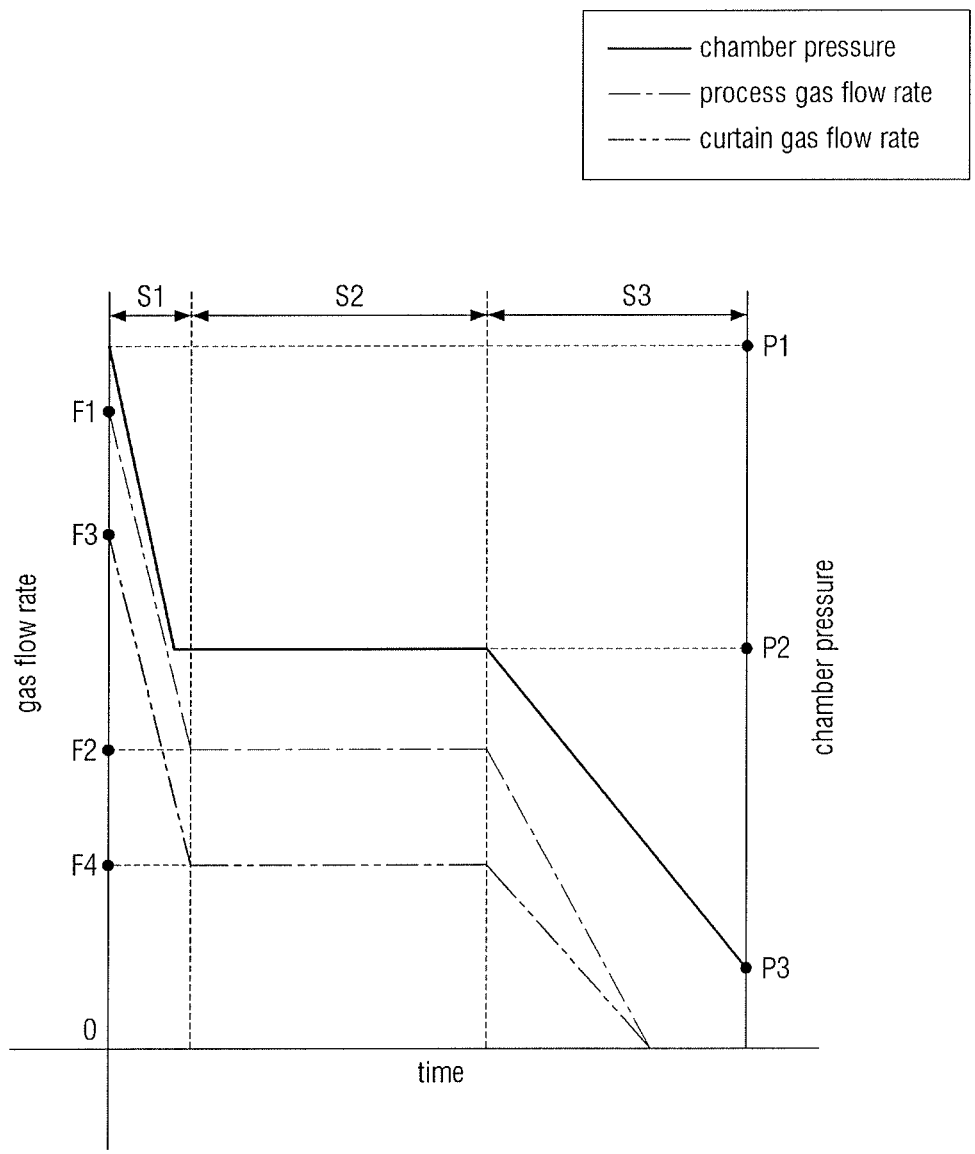

Hereinafter, spraying the process gas and reducing the pressure in the chamber will be described in more detail with reference to FIG. 11. FIG. 11 illustrates a graph showing the change of chamber pressure and the change of gas flow rate with respect to time in the processes illustrated with respect to FIG. 10.

In an exemplary embodiment, at least portion of spraying the process gas and at least portion of reducing the pressure in the chamber may be simultaneously performed. In this case, the process of reducing the pressure in the chamber 100 and spraying the process gas may include a first section S1, which is initial depressurization, a second section S2, which is drying diffusion, and a third section S3, which is gas injection completion.

The first section S1, which is an initial depressurization, may include starting a depressurization drying process by reducing the pressure in the chamber 100. For example, the first section S1 may be performed for about 60 seconds to 180 seconds. For example, in the first section S1, the pressure in the chamber 100 may be reduced from a first pressure P1 to a second pressure P2, and the second pressure P2 may then be maintained. For example, the first pressure P1 may be atmospheric pressure, and the second pressure P2 may be about 10 Torr to 100 Torr. Further, in the first section S1, the flow rate of process gas may be reduced from a first flow rate F1 to a second flow rate F2. Moreover, in the first section S1, the flow rate of curtain gas may be reduced from a third flow rate F3, which is lower than the first flow rate F1, to fourth flow rate F4, which is lower than the second flow rate F2.

Subsequently, the second section S2, which is a drying diffusion, may include maintaining the pressure in the chamber 100 and the injection amount of process gas to substantially complete the drying, flattening and stabilizing of an organic film. For example, the second section S2 may be performed for about 250 seconds to 600 seconds. For example, in the second section S2, subsequent to the first section S1, the pressure in the chamber 100 may be maintained at the second pressure P2. Further, in the second section S2, the flow rate of process gas and the flow rate of curtain gas may be maintained at the second flow rate F2 and the fourth flow rate F4, respectively.

The point in time at which the pressure starts to be maintained after reducing the pressure in the chamber 100 may precede the point in time at which the injection amount of process gas and the injection amount of curtain gas start to be maintained. For example, the process of maintaining the pressure in the chamber 100 at the second pressure P2 may be started before the process of maintaining the flow rate of process gas at the second flow rate F2 and maintaining the flow rate of curtain gas at the fourth flow rate F4. For example, the period of time during which the pressure in the chamber 100 is rapidly changed may be set to not exactly match the period of time during which the flow rate of gas is rapidly changed, thereby making the atmosphere in the chamber 100 stable and facilitating exhaustion under reduced pressure.

Subsequently, the third section S3, which is a gas injection completion, may include reducing the flow rate of gas, removing the residual solvent, and stabilizing the surface of the formed organic film. For example, the third section S3 may be performed for about 200 seconds to 300 seconds.

For example, in the third section S3, the pressure in the chamber 100 may be reduced from the second pressure P2 to the third pressure P3, and the exhaustion under reduced pressure may be completed. The third pressure P3 may be about $10^{-4}$ Torr to $10^{-1}$ Torr. Further, in the third section S3, the flow rate of process gas may be reduced from the second flow rate F2, and the injection of process gas may be completed. Moreover, in the third section S3, the flow rate of curtain gas may be reduced from the fourth flow rate F4, and the injection of curtain gas may be completed. In this case, the change rate of flow rate of process gas per unit time may be greater than the change rate of flow rate of curtain gas per unit time. The injection of process gas and the injection of curtain gas may be completed sooner than the exhaustion under reduced pressure. The change rate of pressure per unit time in reducing the first pressure P1 to the second pressure P2 may be greater than the change rate of pressure per unit time in the third section S3, for example, in reducing the second pressure P2 to the third pressure P3. Drying characteristics may be further improved by allowing the pressure change in the third section S3 of removing the residual solvent and stabilizing the surface of an organic film to be moderate.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

Figure 12:
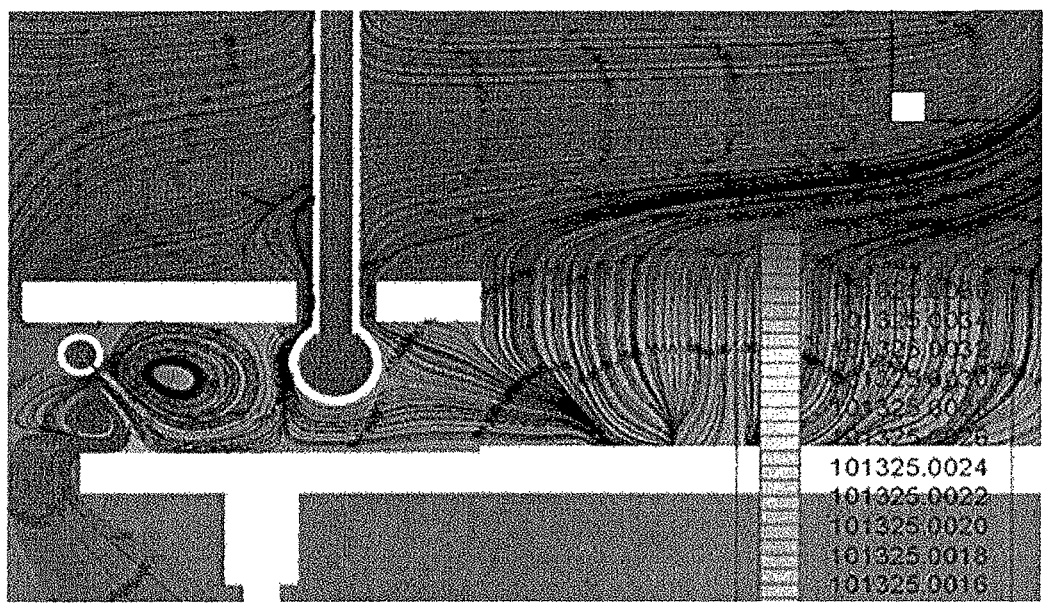
FIG. 12 illustrates a view showing an image simulating a gas flow path according to Example 1.

While the flow rate of nitrogen ($N_2$) gas of 300° C. sprayed through the injection holes of the nozzle tips was maintained at 0.5 SLM and the flow rate of nitrogen ($N_2$) gas of 120° C. sprayed through the injection holes of the curtain gas injection nozzle was maintained at 0.5 SLM, the flow path of nitrogen ($N_2$) was simulated. The results thereof are shown in FIG. 12.

EXAMPLE 2

While the flow rate of nitrogen ($N_2$) gas of 300° C. sprayed through the injection holes of the nozzle tips was maintained at 3 SLM and the flow rate of nitrogen ($N_2$) gas of 120° C. sprayed through the injection holes of the curtain gas injection nozzle was maintained at 2 SLM, the flow path of nitrogen ($N_2$) gas was simulated. The results thereof are shown in FIG. 13.

COMPARATIVE EXAMPLE

While the flow rate of nitrogen ($N_2$) gas of 300° C. sprayed through the injection holes of the nozzle tips was maintained at 1 SLM and the flow rate of nitrogen ($N_2$) gas of 120° C. sprayed through the injection holes of the curtain gas injection nozzle was maintained at 2 SLM, the flow path of nitrogen ($N_2$) was simulated. The results thereof are shown in FIG. 14.

Figure 13:
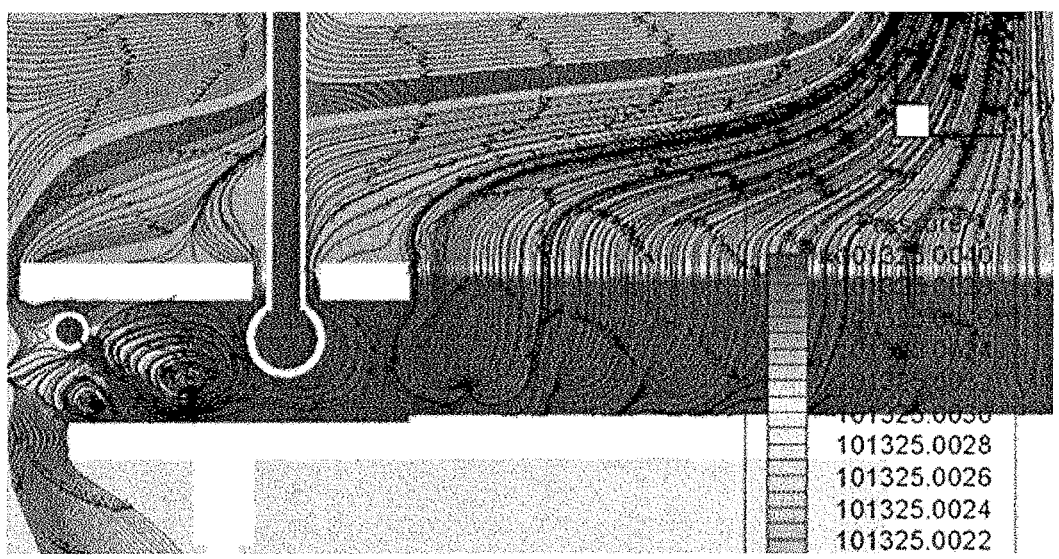
FIG. 13 illustrates a view showing an image simulating a gas flow path according to Example 2.
Figure 14:
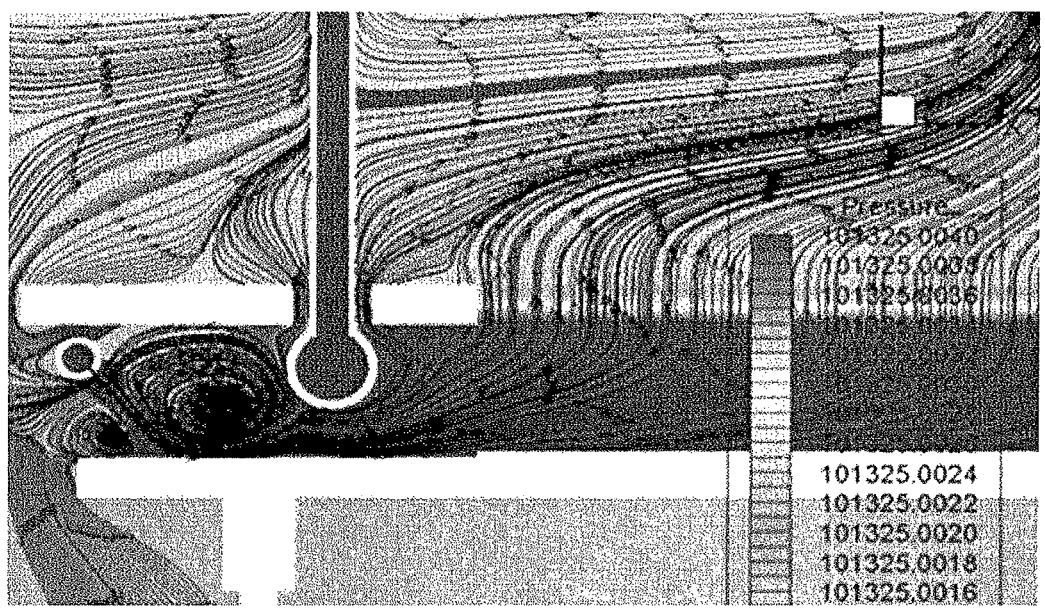
FIG. 14 illustrates a view showing an image simulating a gas flow path according to Comparative Example.

FIG. 12 illustrates an image simulating the gas flow path according to Example 1, FIG. 13 illustrates an image simulating the gas flow path according to Example 2, and FIG. 14 illustrates an image simulating the gas flow path according to Comparative Example.

Referring to FIG. 12, it can be ascertained that when the flow rate of process gas is equal to the flow rate of curtain gas, the curtain gas sprayed through the injection holes of the curtain gas injection nozzle forms a closed curve stream, so as to effectively block the substrate drying space.

Referring to FIG. 13, it can be ascertained that when the flow rate of process gas is higher than the flow rate of curtain gas, the curtain gas sprayed through the injection holes of the curtain gas injection nozzle forms a clear closed curve stream, and the process gas sprayed through the injection holes of the nozzle tips does not leak at all to the outside of the substrate drying space.

Referring to FIG. 14, it can be ascertained that, when the flow rate of process gas is lower than the flow rate of curtain gas, the curtain gas sprayed through the injection holes of the curtain gas injection nozzle forms a complex stream, and a connection stream is formed between the inside and outside of the substrate drying space.

By way of summation and review, as a method for forming an organic film on a substrate, an organic solution may be discharged onto a desired portion of the substrate through a solution coating process, such as inkjet printing or nozzle printing. The organic solution on the substrate may be brought into contact with a high-temperature inert gas to dry and bake this organic solution. However, it is possible that the organic solution may not be uniformly dried when the heating path of the organic solution is changed depending on the discharge position thereof, particularly when a substrate, such as an organic light-emitting display panel substrate, has a large area.

Embodiments provide a vacuum drying apparatus that can uniformly dry an organic solution on a substrate.

Embodiments provide a method of manufacturing a film, in which a drying uniformity of an organic solution may be improved and a content of impurities may be be minimized by using the vacuum drying apparatus.

According to embodiments heating plates are disposed over and under a substrate. Accordingly, the condensation of a solvent vapor can be prevented or avoided, thereby a film to be manufactured having improved dry uniformity and a minimum content of impurities.

According to embodiments, a gas distribution pipe is disposed over a baffle plate. Accordingly, the thermal conductivity in a substrate drying space can be uniformly maintained, and the flow of inert gas is not obstructed, so as to reduce the difference in flow path depending on the position of a substrate. Moreover, a degree of freedom in design of the structure of a gas distribution pipe, that is, the flow path of inert gas is increased. The gas distribution pipe is designed in the form of a cascade to reduce the difference in distance from an inert gas supply source, so as to maintain the injection amount of inert gas uniformly.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. A method of manufacturing a film, the method comprising:

disposing a substrate under one side of a baffle plate in a film manufacturing space, the baffle plate having a plurality of through-holes and baffle slits; and spraying an inert gas toward the substrate through a plurality of nozzle tips branched from each of a plurality of gas distribution pipes that is disposed over another side of the baffle plate such that the inert gas penetrates the baffle plate through the through-holes, wherein the plurality of gas distribution pipes extend along the another side of the baffle plate in a first direction, and are adjacently arranged in a second direction crossing the first direction, and wherein the sprayed inert gas is exhausted through the baffle slits of the baffle plate.

2. The method as claimed in claim 1, wherein:

the substrate is a base substrate that has an organic material layer thereon, and spraying the inert gas dries the organic material layer to form the film, the film being an organic film.

3. The method as claimed in claim 1, further comprising:

reducing a pressure in the film manufacturing space, wherein:

reducing the pressure includes reducing the pressure from a first pressure to a second pressure, the second pressure being lower than the first pressure, for a first period of time, and maintaining the second pressure for second period of time, the second period of time being longer than the first period of time, spraying the inert gas includes spraying the inert gas for third period of time while reducing a flow rate of the inert gas from a first flow rate to a second flow rate, the second flow rate being lower than the first flow rate, and spraying the inert gas for a fourth period of time, the fourth period of time being longer than the third period of time, while maintaining the second flow rate, the first period of time overlaps the third period of time, and the second period of time overlaps the fourth period of time, and beginning of maintaining the second pressure for the second period of time precedes beginning of maintaining the second flow rate of spraying the inert gas for the fourth period of time.

4. The method as claimed in claim 3, wherein:

reducing the pressure further includes reducing the pressure from the second pressure to a third pressure, the third pressure being lower than the second pressure, after maintaining of second pressure, and a change rate of pressure per unit time in reducing the pressure from the first pressure to the second pressure is greater than a change rate of pressure per unit time in reducing the pressure from the second pressure to the third pressure.

5. The method as claimed in claim 1, further comprising:

heating the baffle plate;

heating a heating plate that is located on an opposite side of the substrate from the baffle plate; and heating a lateral heating plate that is located on a lateral side of a substrate drying space defined between the substrate and the baffle plate, wherein:

a heating temperature of the heating plate is higher than a heating temperature of the baffle plate, the heating temperature of the baffle plate is higher than a heating temperature of the lateral heating plate, and the heating temperature of the baffle plate is 250° C. or higher.

6. The method as claimed in claim 1, further comprising:
spraying a curtain gas using a curtain gas injection nozzle that surrounds a substrate drying space defined between the substrate and the baffle plate, the curtain gas injection nozzle including injection holes,
wherein a flow rate of the inert gas sprayed through the injection holes of the nozzle tips is 1 to 3 times the flow rate of the curtain gas sprayed through the injection holes of the curtain gas injection nozzle.

7. The method as claimed in claim 1, wherein:
the inert gas is supplied from a gas supply source through a gas supply pipe connected with the gas supply source, the gas distribution pipes connected with the gas supply pipe, and the plurality of nozzle tips branched from the gas distribution pipes, and
a length of a first flow path extending from a point at which the gas supply pipe is directly connected with each of the gas distribution pipes to one end of each of the gas distribution pipes is equal to a length of a second flow path extending from the point at which the gas supply pipe is directly connected with each of the gas distribution pipes to another end of each of the gas distribution pipes.

8. The method as claimed in claim 7, wherein:
a number of the gas distribution pipes is $2^n$, where n is an integer of 1 or more,
different ones of the gas distribution pipes are spaced apart from each other in the second direction, and
the lengths of first and second flow paths from the gas supply source to the gas distribution pipes are equal to each other.

9. The method as claimed in claim 1, wherein:
the plurality of nozzle tips includes a first nozzle tip located at one end of each of the gas distribution pipes extending in the first direction, and a second nozzle tip located nearer to a center of each of the gas distribution pipes than the first nozzle tip,
each of the first nozzle tip and the second nozzle tip has at least one injection hole that sprays gas, and
a flow rate of the inert gas sprayed through the injection hole of the first nozzle tip is greater than a flow rate of the inert gas sprayed through the injection hole of the second nozzle tip.

10. The method as claimed in claim 1, wherein:
each of the nozzle tips includes a first injection hole and a second injection hole that spray the inert gas, and
a flow rate of the inert gas sprayed through the first injection hole is different from a flow rate of the inert gas sprayed through the second injection hole.

11. The method as claimed in claim 1, wherein
each of the nozzle tips includes an injection hole that sprays the inert gas, and
an angle between a gas spraying direction of the injection hole and one side of the substrate is 30° to 45°.

12. A method of manufacturing an organic light-emitting device, the method comprising:
providing a substrate including a base substrate and an organic material layer to form at least one of a hole injection layer, a hole transport layer, and an organic luminescent layer on the base substrate,
disposing the substrate on a substrate mounting plate in a film manufacturing space such that the substrate is spaced apart from and facing a baffle plate, the baffle plate having a plurality of through-holes and a plurality of baffle slits, with nozzle tips penetrating respective ones of the through-holes, the nozzle tips being configured to spray a gas toward the substrate mounting plate and being branched from each of a plurality of gas distribution pipes, the plurality of gas distribution pipes extending along one side of the baffle plate in a first direction, and are adjacently arranged in a second direction crossing the first direction,
positioning the substrate mounting plate with respect to a gas flow blocking frame and a curtain gas injection nozzle such that an isolated substrate drying space is defined between the substrate mounting plate and the baffle plate,
spraying an inert process gas toward the substrate through the nozzle tips such that the organic material layer is dried to form the at least one of a hole injection layer, a hole transport layer, and an organic luminescent layer on the base substrate, wherein
the sprayed inert process gas is exhausted through the baffle slits of the baffle plate.

13. The method as claimed in claim 12, further including, during spraying the process gas, heating the baffle plate, heating a heating plate that is located on another side of the substrate from the baffle plate, heating a lateral heating plate that is located on a lateral side of a substrate drying space, and supplying a curtain gas from injection holes of the curtain gas injection nozzle.

14. The method as claimed in claim 13, wherein:
a flow rate of a process gas sprayed through the nozzle tips is 1 to 3 times the flow rate of the curtain gas sprayed through the injection holes of the curtain gas injection nozzle, such that the curtain gas sprayed through the injection holes of the curtain gas injection nozzle forms a closed curve that flows in a periphery of the substrate drying space.

15. The method as claimed in claim 13, wherein:
spraying the process gas toward the substrate through the nozzle tips includes supplying a process gas to the nozzle tips from the gas distribution pipes located on an opposite side of the baffle plate from the substrate mounting plate in a chamber, the gas distribution pipes being connected to a gas supply through a gas supply pipe having a cascading configuration such that flow paths from the gas supply to the gas distribution pipes are about equal in length.

16. The method as claimed in claim 14, wherein:
each of the nozzle tips includes a first injection hole and a second injection hole facing in opposite directions, a diameter of the first injection hole and the second injection hole being selected according to a location of each of the nozzle tips to provide uniform drying of the substrate.

* * * * *